United States Patent
Lai et al.

(10) Patent No.: US 10,281,489 B1
(45) Date of Patent: May 7, 2019

(54) TEST SIGNALS CONDUCTION DEVICE

(71) Applicant: WINWAY TECHNOLOGY CO., LTD., Kaohsiung (TW)

(72) Inventors: Chyi-Lang Lai, Kaohsiung (TW); Hong-Chi Hung, Kaohsiung (TW)

(73) Assignee: WINWAY TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/862,193

(22) Filed: Jan. 4, 2018

(51) Int. Cl.
| | |
|---|---|
| *G01R 1/04* | (2006.01) |
| *G01R 31/28* | (2006.01) |
| *G01R 1/067* | (2006.01) |
| *H01R 13/24* | (2006.01) |
| *G01R 31/3177* | (2006.01) |

(52) U.S. Cl.
CPC ....... *G01R 1/0408* (2013.01); *G01R 1/06722* (2013.01); *G01R 31/2889* (2013.01); *G01R 31/2896* (2013.01); *G01R 31/3177* (2013.01); *H01R 13/2421* (2013.01)

(58) Field of Classification Search
CPC ............ G01R 31/3177; G01R 31/2896; G01R 1/06722
See application file for complete search history.

(56) References Cited

U.S. PATENT DOCUMENTS

| | | | | | |
|---|---|---|---|---|---|
| 2010/0255706 | A1* | 10/2010 | Hsiao | ................... | H05K 7/1069 439/331 |
| 2010/0255707 | A1* | 10/2010 | Chen | ................... | H05K 7/1007 439/331 |
| 2013/0252450 | A1* | 9/2013 | Lin | ......................... | H05K 7/10 439/330 |

* cited by examiner

*Primary Examiner* — Giovanni Astacio-Oquendo
*Assistant Examiner* — Alvaro E Fortich
(74) *Attorney, Agent, or Firm* — Muncy, Geissler, Olds & Lowe, P.C.

(57) ABSTRACT

For electrically connecting an integrated circuit under test to a test circuit board, a test signals conduction device includes a contact member and a spring member. The contact member has a main portion, a contact portion and an extension portion. When the contact portion is pressed by the integrated circuit, the contact portion and the extension portion rotate about the main portion in a first direction, thereby causing the spring member to deform and switch to an energy storing state from a normal state. When the integrated circuit board is moved away from the contact portion, the spring member returns from the energy storing state to the normal state and causes the extension portion and the contact portion to rotate in a second direction.

9 Claims, 13 Drawing Sheets

TEST SIGNALS CONDUCTION DEVICE

FIELD

The disclosure relates to a test signals conduction device, and more particularly to a test signals conduction device for use in testing an integrated circuit package.

BACKGROUND

Referring to FIGS. 1 and 2, an integrated circuit 1 that has a plurality of pins 11 (only one pin 11 is shown in FIG. 2) and that has been packaged is electrically connected to a test circuit board 2 through an existing test signals conduction device 3 to test whether the integrated circuit 1 functions properly. The existing test signals conduction device 3 includes a base seat 31, four rubber shafts 32 and a plurality of contact members 33 respectively and rotatably mounted to the rubber shafts 32.

Each contact member 33 has a main portion 331 disposed around the respective rubber shaft 32, and a contact portion 332 that extends from a top end of the main portion 331 to electrically contact the pin 11 of the integrated circuit 1. A bottom end 333 of the main portion 331 electrically connects the test circuit board 2.

As shown in FIG. 2, when the pin 11 initially contacts the contact member 33, the contact portion 332 of the contact member 33 is situated in an initial position and the contact portion 332 contacts an outer edge of the respective pin 11. As shown in FIG. 3, when the integrated circuit 1 is pushed to press the contact member 33 against the test circuit board 2, the main portion 331 of the contact member 33 rotates about the rubber shaft 32 as a fulcrum. In this situation, the contact member 33 is in a sliding position. Rotation of the contact member 33 about the rubber shaft 32 results in the following effects: Firstly, the rotation causes the rubber shaft 32 to deform and store energy; secondly, the contact portion 332 not only moves downward by the pressure of the integrated circuit 1 but also slides over the respective pin 11 from the outer edge in an inward direction. Through such sliding movement, each contact member 33 can wipe over the contact surface of the respective pin 11, ensuring a complete electrical connection with the test circuit board 2 to finish the testing of the integrated circuit 1. As shown in FIG. 4, when the integrated circuit 1 is moved away from the contact member 33, the rubber shaft 32 releases its stored energy and returns to its initial position for subsequent testing of a next integrated circuit 1.

However, the existing test signals conduction device 3 encounters a problem because the contact members 33 are made of a heat-resistance metal, and the rubber shafts 32 are not heat resistant. During testing the integrated circuit 1, the rubber shafts 32 are subjected to high temperature, and are susceptible to permanent deformation and softening losing their elastic properties after a long term of use. The function of the test signals conduction device 3 therefore becomes ineffective. Further, replacement of the rubber shafts 37 can increase costs and is time-consuming.

SUMMARY

Therefore, an object of the disclosure is to provide a test signals conduction device that can alleviate at least one drawback of the prior art.

According to the disclosure, a test signals conduction device for electrically connecting an integrated circuit under test to a test circuit board includes a base seat, a contact member and a spring member.

The base seat has a top side, a bottom side for being disposed on the test circuit board, an installation recess indented from the top side for receiving the integrated circuit board, a receiving recess indented from the bottom side and communicated with the installation recess, and a spring-retaining part adjoining the receiving recess.

The contact member includes a main portion, a contact portion and an extension portion. The main portion is disposed in the receiving recess and configured to electrically contact the test circuit board. The contact portion projects from the main portion to the installation recess for electrically contacting the integrated circuit under test. The extension portion extends from the main portion in a direction opposite to the contact portion and away from the test circuit board.

The spring member is disposed between and adjoins the extension portion and the spring-retaining part of the base seat. The spring member is deformable to switch between a normal state and an energy storing state.

When the contact portion is pressed by the integrated circuit under test toward the test circuit board, the contact portion and the extension portion rotate in a first direction about the main portion as a fulcrum, and the extension portion causes the spring member to deform and switch to the energy storing state from the normal state.

When the integrated circuit under test is moved away from the contact portion and the installation recess, the spring member returns from the energy storing state to the normal state and causes the extension portion and the contact portion to rotate about the main portion in a second direction opposite to the first direction.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
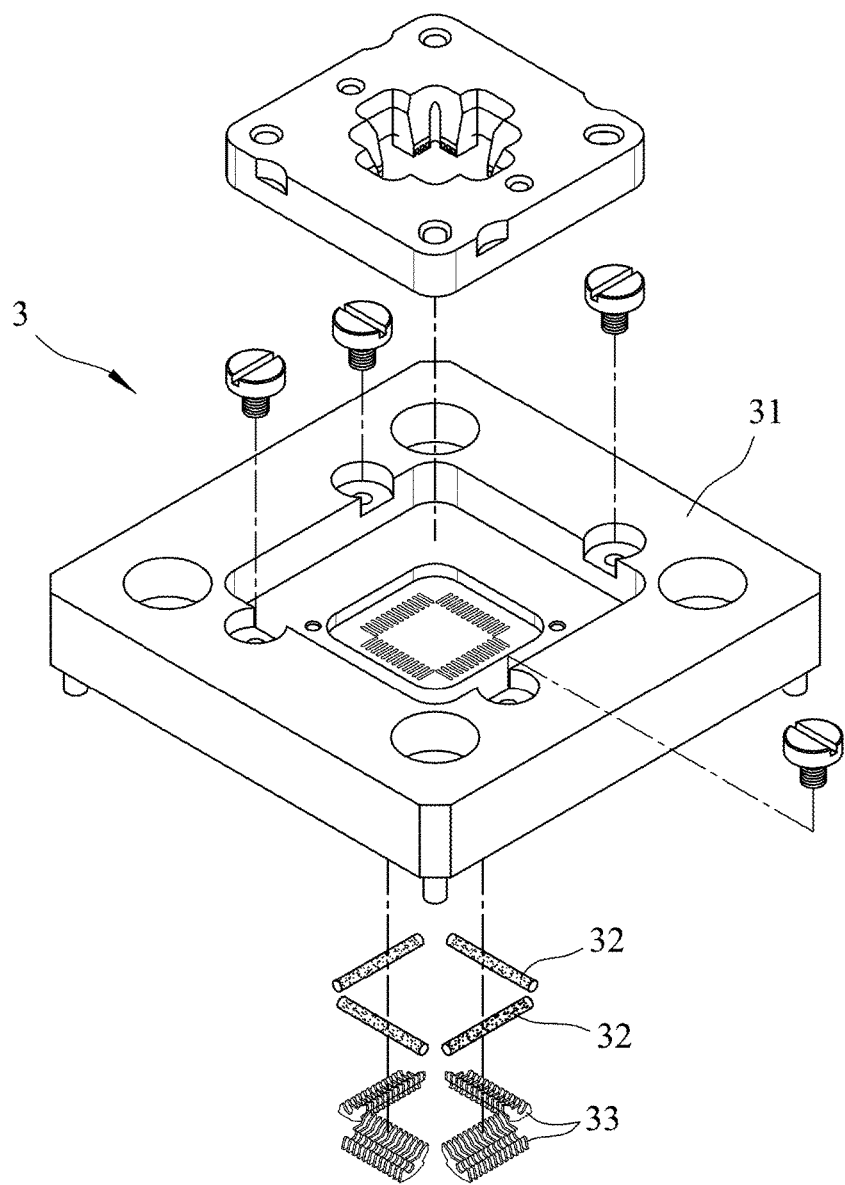
FIG. 1 is an exploded view illustrating an existing test signals conduction device.
Figure 2:
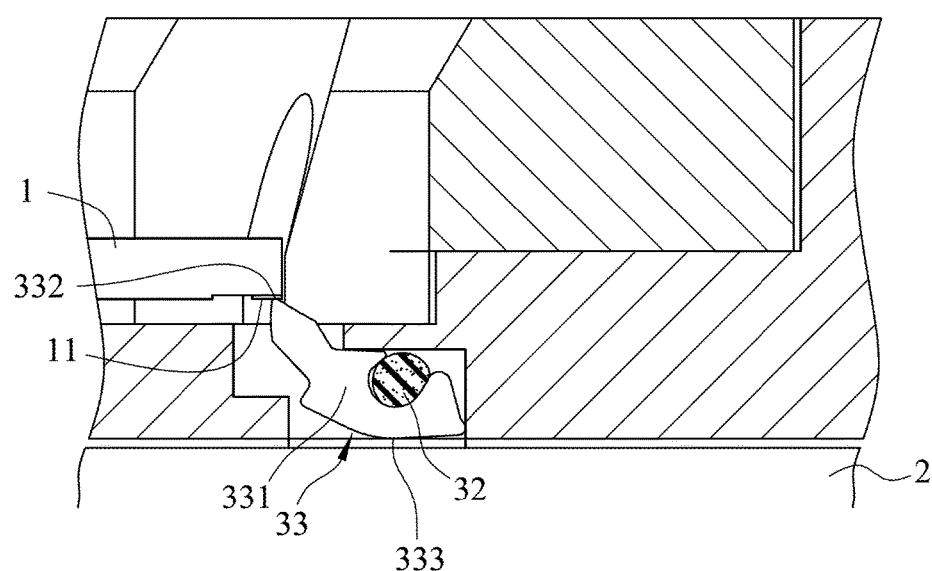
FIG. 2 is a fragmentary sectional view, illustrating an integrated circuit under test disposed in the existing test signals conduction device to connect a test circuit board.
Figure 3:
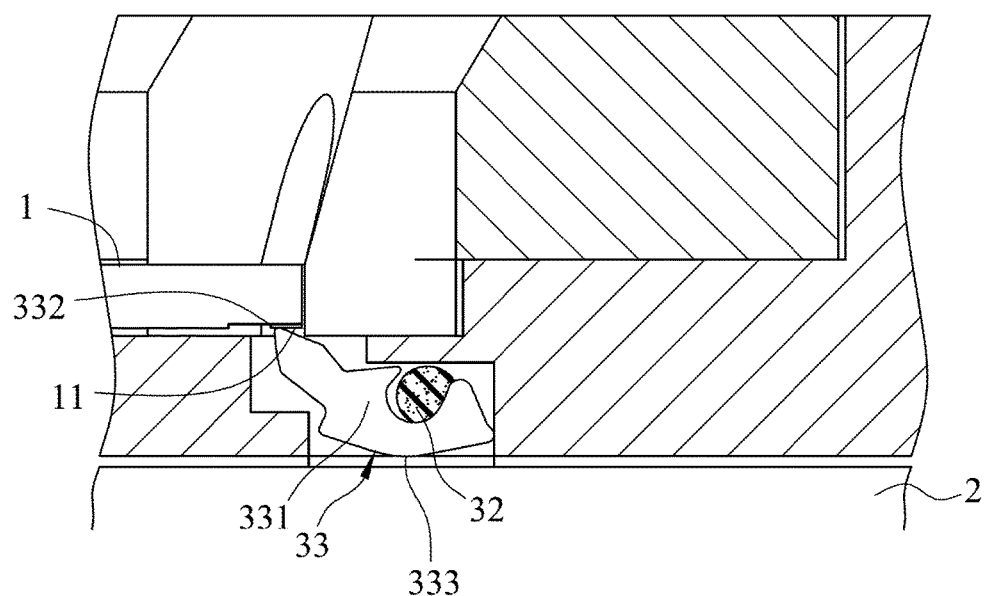
FIG. 3 is a view similar to FIG. 2, but illustrating the integrated circuit under test being pressed against the existing test signals conduction device.
Figure 4:
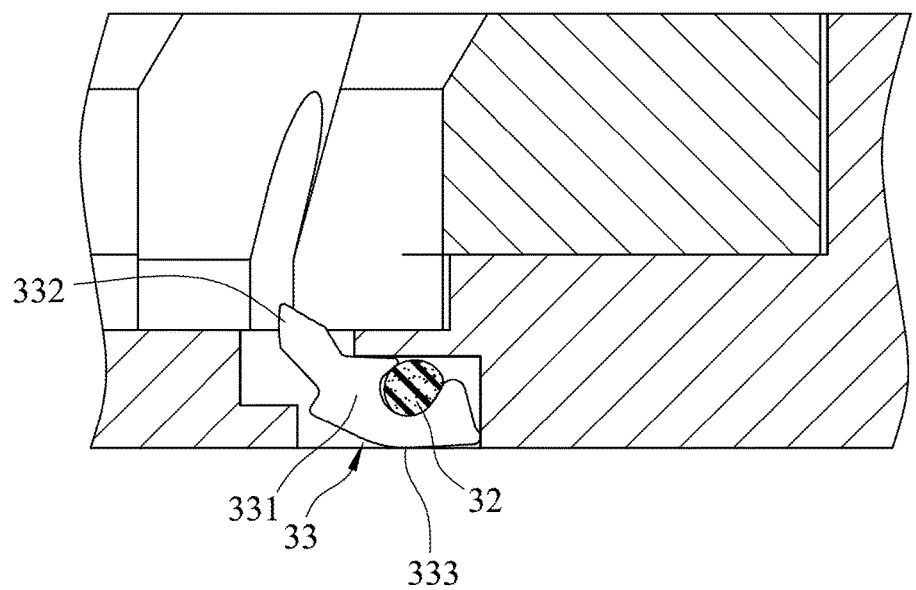
FIG. 4 is similar to FIG. 2, illustrating the integrated circuit under test being removed from the existing test signals conduction device.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 5:
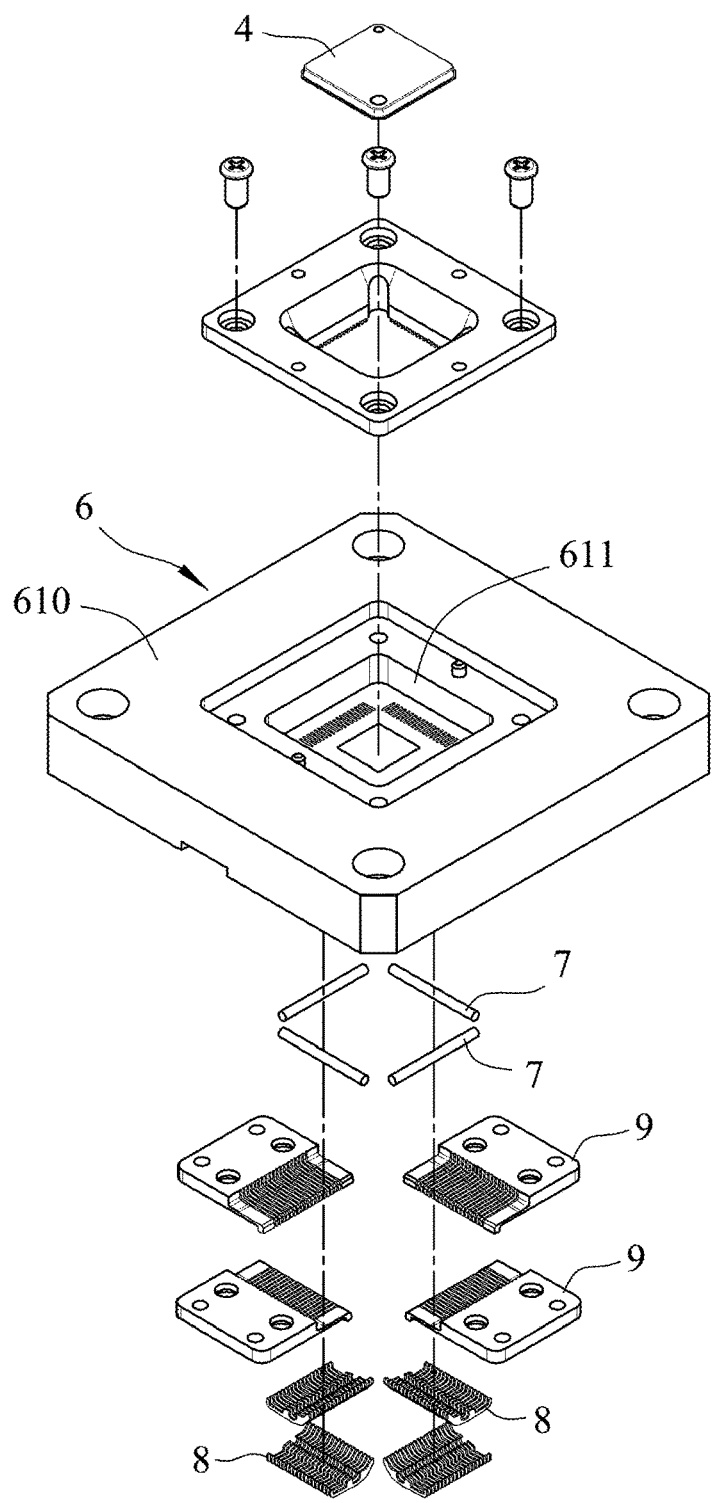
FIG. 5 is an exploded perspective view, illustrating a first embodiment of a test signals conduction device according to the disclosure.
Figure 6:
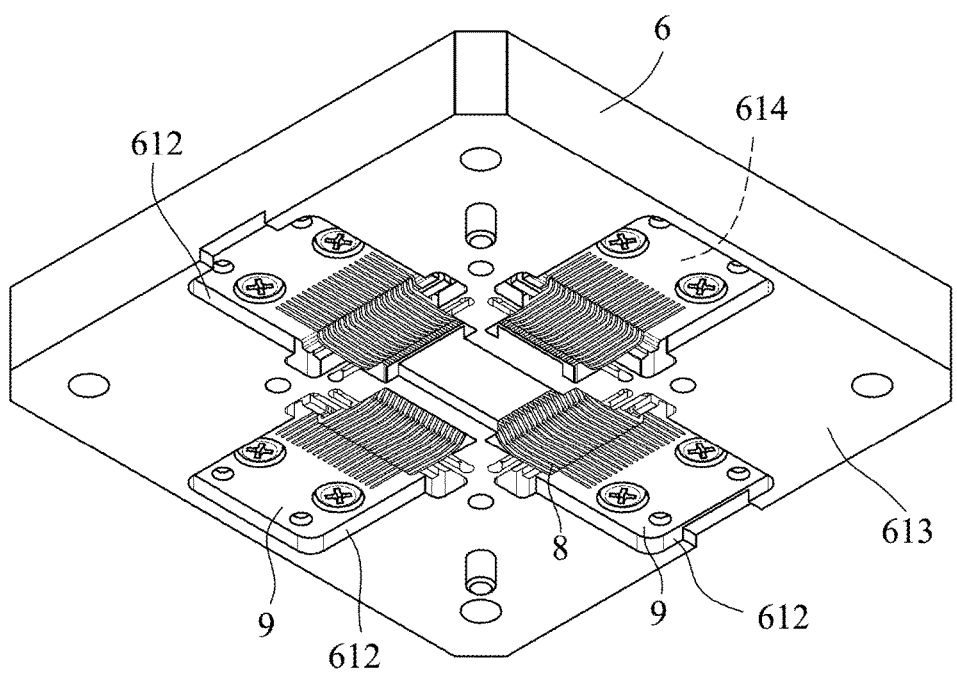
FIG. 6 is a top perspective view of the first embodiment.
Figure 7:
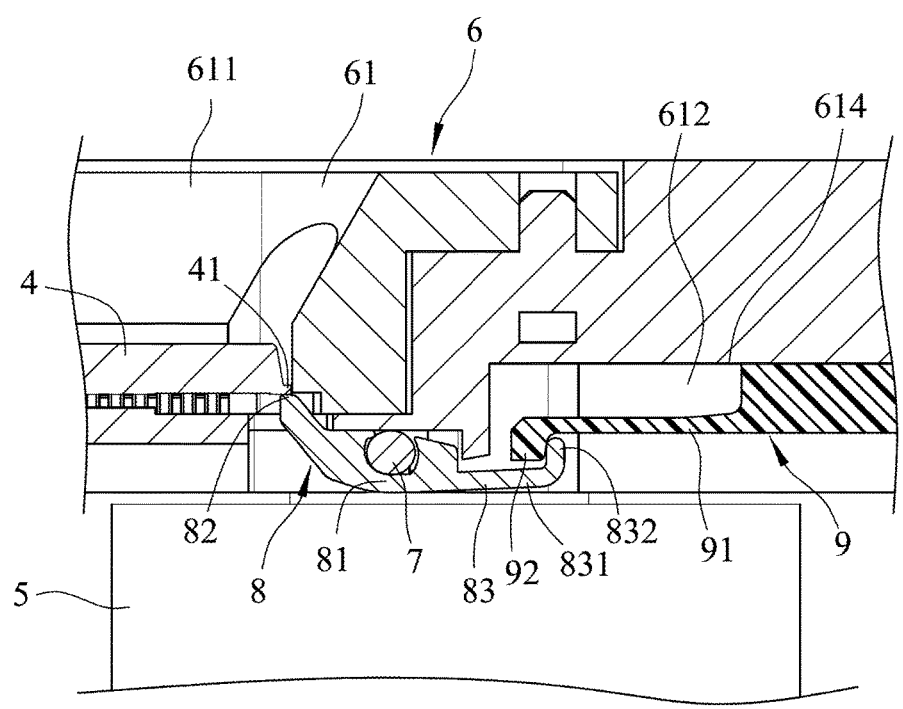
FIG. 7 is a fragmentary sectional view, illustrating an integrated circuit under test disposed in the test signals conduction device of the first embodiment.

Referring to FIGS. 5 to 7, according to a first embodiment of the present disclosure, a test signals conduction device is suitable for electrically connecting a plurality of pins 41 (only one is shown in FIG. 7) of an integrated circuit 4 under test to a test circuit board 5.

The test signals conduction device includes a base seat 6, four non-deformable insulation shafts 7, a plurality of contact members 8 arranged in four groups, and four spring members 9.

The base seat 6 has a top side 610, a bottom side 613 for being disposed on the test circuit board 5, an installation recess 611 indented from the top side 610 for receiving the integrated circuit board 4, four receiving recesses 612 indented from the bottom side 613 and communicated with the installation recess 611, and four spring-retaining parts 614 adjoining the respective receiving recesses 612 (see FIGS. 6 and 7).

Each contact member 8 has a main portion 81, a contact portion 82 and an extension portion 83. The main portion 81 is disposed in a respective one of the receiving recesses 612. The contact portion 82 projects from the main portion 81 to the installation recess 611. The extension portion 83 extends from the main portion 81 in a direction opposite to the contact portion 82 and away from the test circuit board 5. The main portions 81 of the contact members 8 are configured to abut and electrically contact the test circuit board 5. The contact portions 82 of the contact members 8 are used for electrically contacting the integrated circuit 4 under test. Although the base seat 6 is designed to be able to position the contact members 8 within the respective receiving recesses 612, the non-deformable insulation shafts 7 are used in the embodiment to extend through the main portions 81 of the respective contact members 8 for enhancing retention of the contact members 8 within the respective receiving recesses 612.

The spring members 9 are fixed to the respective spring-retaining parts 614 (see FIGS. 6 and 7) of the base seat 6, and are made from an engineering plastic material, such as TORLON, EKH-SS11, or WPC1000 materials. In particular, each spring member 9 is disposed between and adjoins the extension portion 83 of the respective contact member 8 and the respective spring-retaining part 614 of the base seat 6 adjoining the respective receiving recess 612.

In this embodiment, the extension portion 83 of each contact member 8 has a stem segment 831 and an upward hook segment 832. The stem segment 831 extends from the main portion 81 along the direction away from the contact portion 82. The upward hook segment 832 extends from the stem segment 831 toward the respective spring member 9. Each spring member 9 has an attachment portion 91 fixed to the spring-retaining part 614 of the base seat 6, and a plurality of downward hook segments 92 extending from the attachment segment 91 toward the respective extension portions 83 and respectively engage the upward hook segment 832 thereof.

Figure 8:
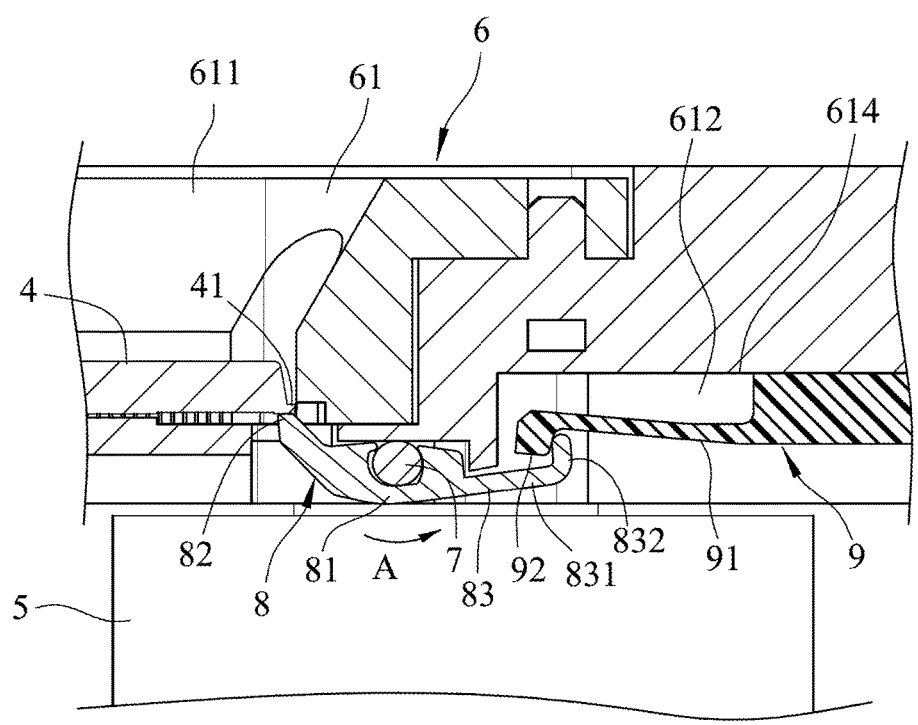
FIG. 8 is a view similar to FIG. 7, but illustrating the integrated circuit under test being pressed against the existing test signals conduction device.

Referring to FIG. 8, in combination with FIG. 7, the spring members 9 are deformable to switch between a normal state and an energy storing state. When the contact portion 82 of each contact member 8 is pressed by the integrated circuit 4 under test against the base seat 6 or toward the test circuit board 5, the contact portion 82 and the extension portion 83 rotate in a first direction (A) about the main portion 81 as a fulcrum, and the extension portion 83 causes the respective spring member 9 to deform and switch to the energy storing state from the normal state.

Figure 9:
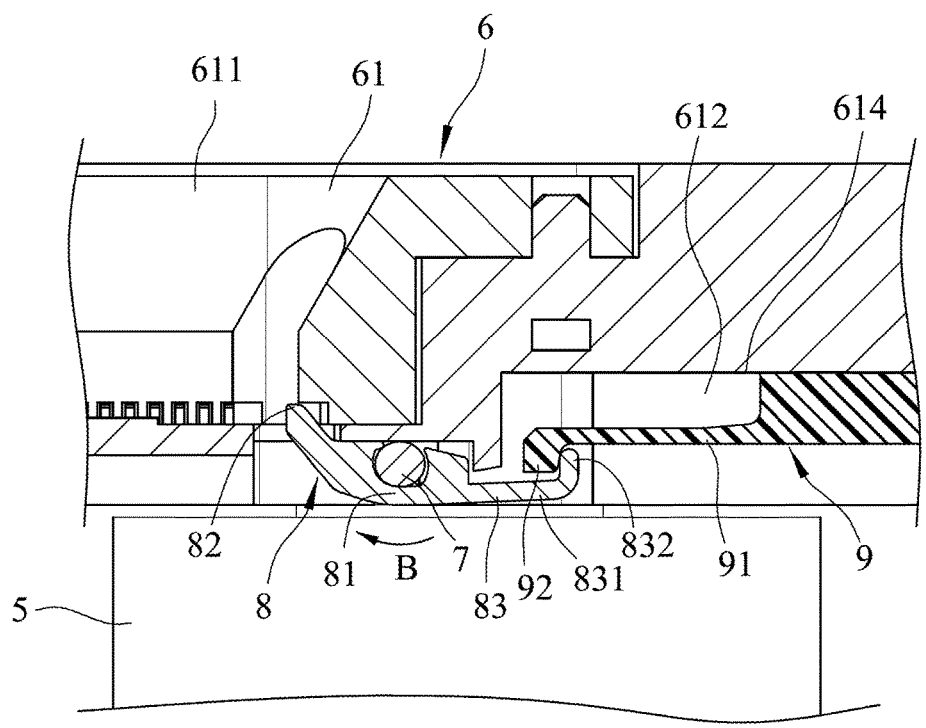
FIG. 9 is similar to FIG. 7, but illustrating the integrated circuit under test being removed from the test signals conduction device.

Referring to FIG. 9, in combination with FIG. 8, when the integrated circuit board 4 under test is removed away from the contact portions 82 of the contact members 8 and the installation recess 611, the spring member 9 returns from the energy storing state to the normal state and causes the extension portion 83 and the contact portion 82 of the respective contact member 8 to rotate about the main portion 81 in a second direction (B) opposite to the first direction (A). As such, the contact portions 82 of the contact members 8 can extend into the installation recess 611.

An interaction between the pins 41 of the integrated circuit 4 under test and the contact members 8 are detailed as follows: As shown in FIG. 7, when the integrated circuit 4 under test is received in the installation recess 611, the contact portion 82 of the contact member 8 contacts an outer edge of the pin 41, and the spring member 9 is in the normal state.

As shown in FIG. 8, when the integrated circuit 4 is pressed downward and toward the test circuit board 5 to apply downward force to the contact portion 82 of each contact member 8, the contact portion 82 and the extension portion 83 rotate in the first direction about the main portion 81. The following effects therefore result:

1. The contact portions 82 of the contact members 8 not only move downward but also gradually slide over the respective pins 41 from the outer edges thereof in an inward direction. Through the sliding movement as such, the contact portions 82 wipe over the respective pins 41. This ensures that complete electrical connection has been established between the pins 41 and the test circuit board 5 and the testing of the integrated circuit 4 is finished.

2. The extension portion 83 rotates upward away from the test circuit board 5 and applies an upward force to the respective spring member 9, thereby deforming the respective spring member 9 and switching the same to the energy storing state from the normal state. Because of high temperature resisting properties, each spring member 9 can endure high temperature and is not prone to permanent deformation and softening upon long term exposure to heat. The test signals conduction device therefore has good performance and can function properly in high temperature applications.

As shown in FIG. 9, after testing the integrated circuit board 4 and removing the integrated circuit board 4 from the installation recess 611, each spring member 9 returns from the energy storing state to the normal state and causes the extension portion 83 and the contact portion 82 to rotate in the second direction (B) about the main portion 81. The contact portion 82 can extend back into the installation recess 611 for testing a next integrated circuit board 4.

Figure 10:
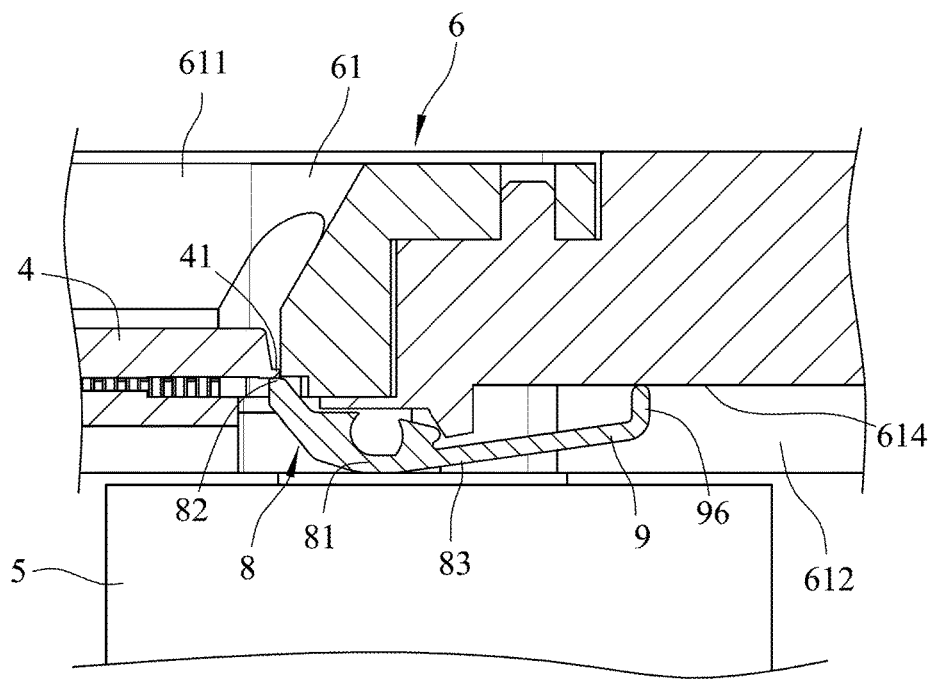
FIG. 10 is a fragmentary sectional view, illustrating a second embodiment of a test signals conduction device according to the disclosure receiving an integrated circuit under test and connecting a test circuit board.
Figure 11:
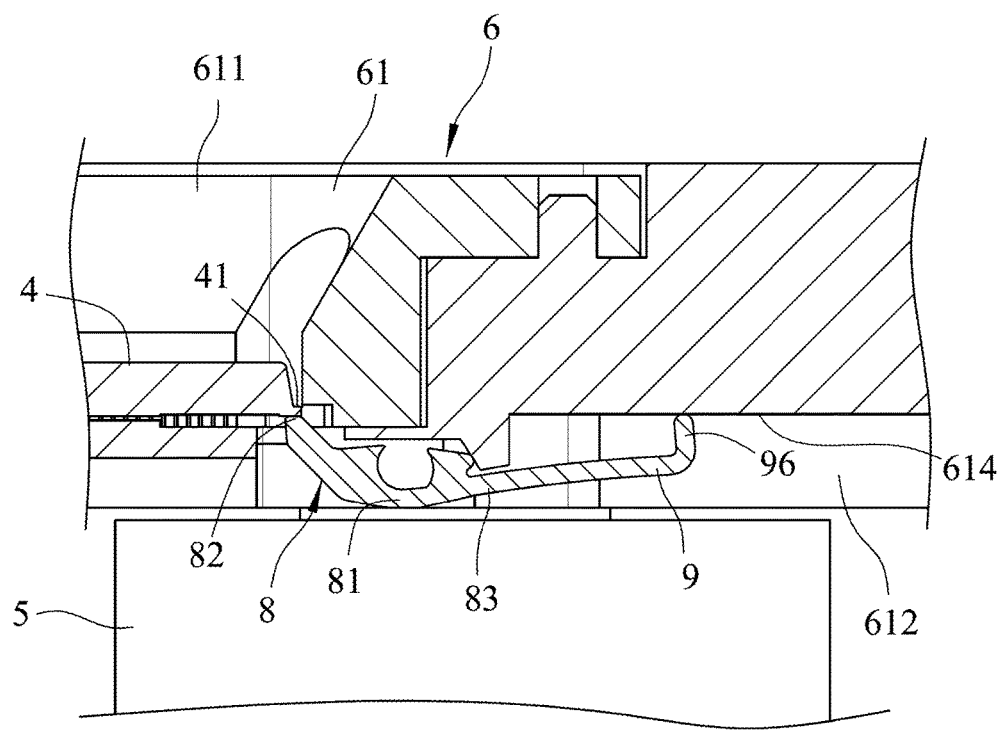
FIG. 11 is a view similar to FIG. 10, but illustrating the integrated circuit under test being pressed against the test signals conduction device.

Referring to FIGS. 10 and 11, a test signals conduction device according to a second embodiment of the present disclosure is shown and has a configuration generally similar to that of the first embodiment. However, in the second embodiment, the non-deformable insulation shafts 7 are omitted, and the contact members 8 are respectively positioned within the receiving recesses 612 by the base seat 6 per se.

Further, the spring members 9 and the contact members 8 are made from the same material with high temperature resistance. Each spring member 9 is integrally formed with the extension portion 83 of the respective contact member 8, but is thinner and longer than the respective contact member 8. Specifically, each spring member 9 extends continuously from the extension portion 83 of the respective contact member 8 and has an upward hook segment 96 abutting against the spring-retaining part 614 of the base seat 6. As each spring member 9 is thinner and longer, it is resiliently deformable and is able to switch between the normal state and the energy storing state.

Moreover, because each spring member 9 is integrally formed with the respective contact member 8, it has no downward hook segment 92 of the first embodiment. In addition, the stem segment 831 and the upward hook segment 832 of the extension portion 83 provided in the first embodiment are omitted in the second embodiment.

Figure 12:
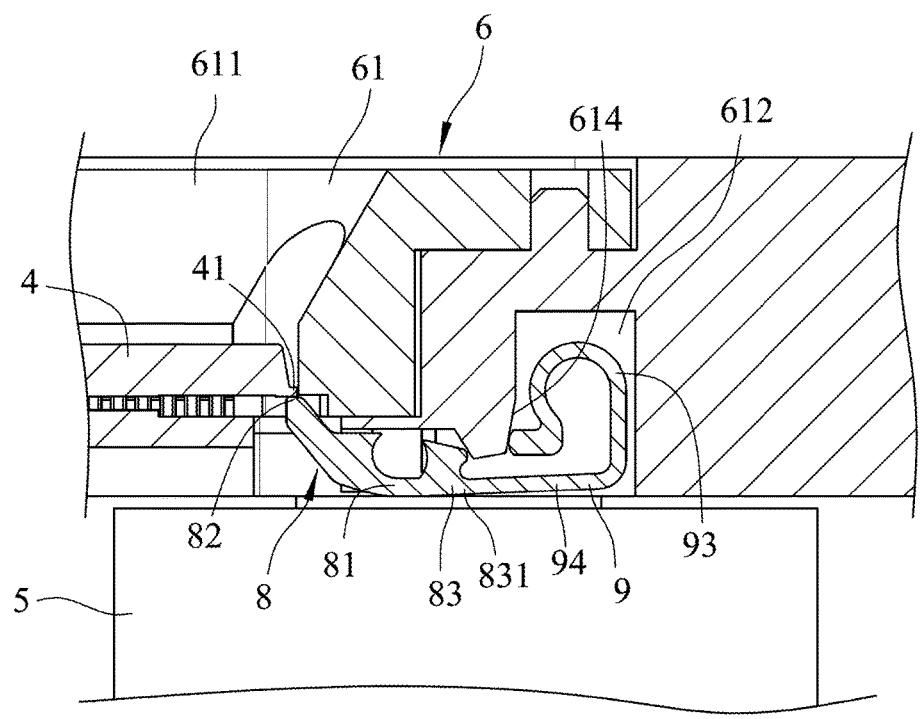
FIG. 12 is a fragmentary sectional view, illustrating a third embodiment of a test signals conduction device according to the disclosure receiving an integrated circuit under test and connecting a test circuit board.
Figure 13:
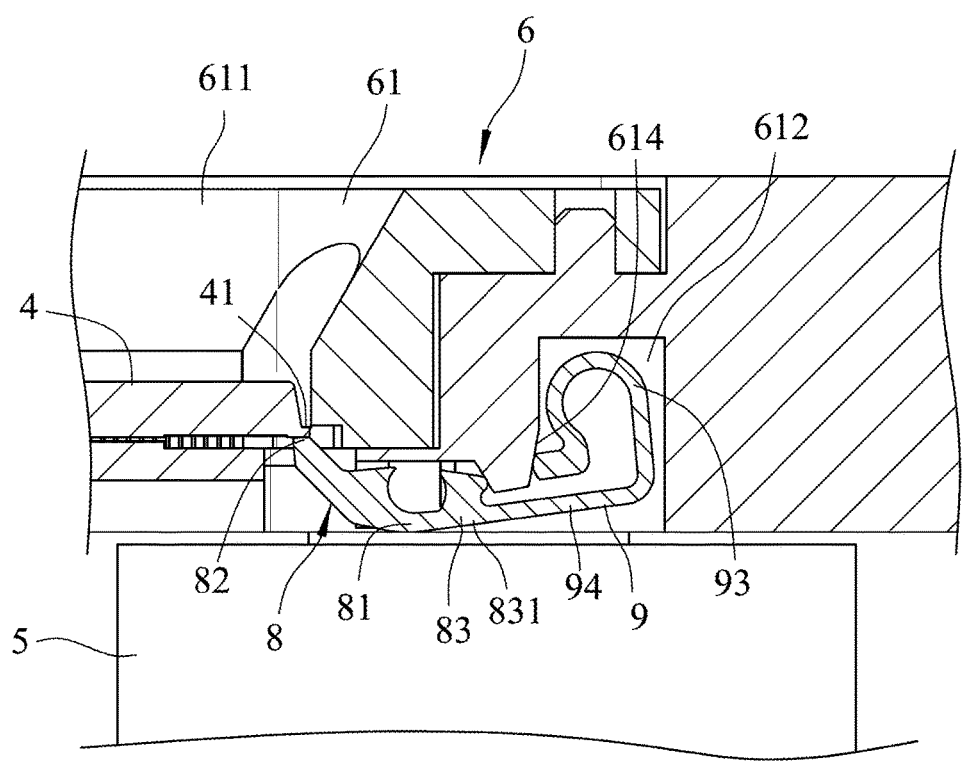
FIG. 13 is a view similar to FIG. 12, but illustrating the integrated circuit under test being pressed against the test signals conduction device.

Referring to FIGS. 12 and 13, a test signals conduction device according to a third embodiment of the present disclosure is shown and has a configuration generally similar to that of the second embodiment. However, in the third embodiment, the downward hook segment 92 of each spring member 9 is omitted. Each spring member 9 has a coiled portion 93 abutting the spring-retaining part 614 of the base seat 6, and a connection portion 94 extending from the coiled portion 93 and integrally formed with the extension portion 83 of the respective contact member 8. By virtue of the coiled configuration of the coiled portion 93, which is disposed in a restricted space, each spring member 9 is more effective to store elastic potential energy compared to the second embodiment.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A test signals conduction device for electrically connecting an integrated circuit under test to a test circuit board, comprising:
   a base seat having a top side, a bottom side for being disposed on the test circuit board, an installation recess indented from said top side for receiving the integrated circuit board, at least one receiving recess indented from said bottom side and communicated with said installation recess, and a spring-retaining part adjoining said receiving recess;
   at least one contact member having
      a main portion disposed in said at least one receiving recess and configured to electrically contact the test circuit board,
      a contact portion projecting from said main portion to said installation recess for electrically contacting the integrated circuit board under test, and
      an extension portion extending from said main portion in a direction opposite to said contact portion and away from the test circuit board; and
   at least one spring member disposed between said extension portion and said spring-retaining part, said at least one spring member being deformable to switch between a normal state and an energy storing state,
   wherein, when said contact portion is pressed by the integrated circuit board under test toward the test circuit board, said contact portion and said extension portion rotate in a first direction about said main portion as a fulcrum, and said extension portion causes said at least one spring member to deform and switch to the energy storing state from the normal state, and
   wherein, when the integrated circuit board under test is moved away from said contact portion and said installation recess, said at least one spring member returns from the energy storing state to the normal state and causes said extension portion and said contact portion to rotate about said main portion in a second direction opposite to the first direction.

2. The test signals conduction device as claimed in claim 1, wherein said at least one contact member includes a plurality of contact members.

3. The test signals conduction device as claimed in claim 2, wherein said at least one spring member includes a plurality of spring members, the number of said contact members being equal to the number of said spring members.

4. The test signals conduction device as claimed in claim 3, wherein each of said spring members is integrally formed with said extension portion of a respective one of said contact members.

5. The test signals conduction device as claimed in claim 3, wherein each of said spring members has a coiled portion abutting said spring-retaining part of said base seat, and a connection portion extending from said coiled portion and integrally formed with said extension portion of the respective one of said contact members.

6. The test signals conduction device as claimed in claim 1, wherein said at least one spring member is made from an engineering plastic material.

7. The test signals conduction device as claimed in claim 1, wherein said extension portion of said at least one contact member has a stem segment and an upward hook segment, said stem segment extending from said main portion along the direction away from said contact portion, said upward hook segment extending from said stem segment toward said at least one spring member, said at least one spring member having an attachment portion connected to said spring-retaining part of said base seat, and a downward hook segment extending from said attachment segment toward said extension portion and engaging said upward hook segment.

8. The test signals conduction device as claimed in claim 1, wherein said at least one spring member extends continuously from said extension portion and having an upward hook segment abutting against said spring-retaining part of said base seat.

9. The test signals conduction device as claimed in claim 1, wherein said at least one contact member further has a non-deformable insulation shaft extending through said main portion to retain said at least one contact member within said at least one receiving recess.

* * * * *